United States Patent
Ota et al.

(10) Patent No.: US 9,685,462 B2
(45) Date of Patent: Jun. 20, 2017

(54) SEMICONDUCTOR DEVICE AND METHOD OF MANUFACTURING THE SAME

(71) Applicant: Kabushiki Kaisha Toshiba, Minato-ku (JP)

(72) Inventors: Kensuke Ota, Kawasaki (JP); Masumi Saitoh, Yokkaichi (JP); Kiwamu Sakuma, Yokkaichi (JP); Daisuke Matsushita, Fujisawa (JP); Chika Tanaka, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/791,653

(22) Filed: Jul. 6, 2015

(65) Prior Publication Data

US 2016/0013214 A1 Jan. 14, 2016

(30) Foreign Application Priority Data

Jul. 10, 2014 (JP) ................................. 2014-141892

(51) Int. Cl.
*H01L 27/12* (2006.01)
*H01L 29/786* (2006.01)
(Continued)

(52) U.S. Cl.
CPC ........ *H01L 27/1225* (2013.01); *H01L 21/465* (2013.01); *H01L 21/467* (2013.01);
(Continued)

(58) Field of Classification Search
None
See application file for complete search history.

(56) References Cited

U.S. PATENT DOCUMENTS

| | | |
|---|---|---|
| 2008/0035920 A1 | 2/2008 | Takechi et al. |
| 2012/0097942 A1 | 4/2012 | Imoto et al. |
| 2013/0119377 A1* | 5/2013 | Noda ................ H01L 29/66969 257/43 |

FOREIGN PATENT DOCUMENTS

| | | |
|---|---|---|
| JP | 2008-40343 | 2/2008 |
| JP | 2012-33778 | 2/2012 |

(Continued)

OTHER PUBLICATIONS

Jaechul Park et al. "Self-Aligned Top-Gate Amorphous Gallium Indium Zinc Oxide Thin Film Transistors", Applied Physics Letters, vol. 93, 2008, 4 pages.

(Continued)

*Primary Examiner* — Matthew Reames
*Assistant Examiner* — Steven B Gauthier
(74) *Attorney, Agent, or Firm* — Oblon, McClelland, Maier & Neustadt, L.L.P.

(57) ABSTRACT

A semiconductor device of an embodiment includes an oxide semiconductor layer including a first region, a second region and the third region provided between the first region and the second region. The oxide semiconductor layer contains indium (In), gallium (Ga), and zinc (Zn). The first and second regions have thinner film thickness and lower indium (In) concentration than the third region. An insulating film is provided on the third region, and an electrode is provided on the insulating film. A first conductive layer is provided under the first region and electrically connected with the first region. A second conductive layer is provided under the second region and electrically connected with the second region.

8 Claims, 10 Drawing Sheets

(51) Int. Cl.
*H01L 29/66* (2006.01)
*H01L 21/467* (2006.01)
*H01L 21/477* (2006.01)
*H01L 21/465* (2006.01)
H01L 27/06 (2006.01)
H01L 21/8258 (2006.01)
H01L 27/088 (2006.01)

(52) U.S. Cl.
CPC ...... *H01L 21/477* (2013.01); *H01L 29/66969* (2013.01); *H01L 29/7869* (2013.01); *H01L 29/78696* (2013.01); *H01L 21/8258* (2013.01); *H01L 27/0688* (2013.01); *H01L 27/088* (2013.01)

(56) References Cited

FOREIGN PATENT DOCUMENTS

| | | |
|---|---|---|
| JP | 2012-109550 | 6/2012 |
| JP | 2013-219345 | 10/2013 |

OTHER PUBLICATIONS

K. Kaneko et al. "Highly Reliable BEOL-Transistor with Oxygen-Controlled InGaZnO and Gate/Drain Offset Design for High/Low Voltage Bridging I/O Operations", Electron Devices Meeting (IEDM), 2011 IEEE International, 4 pages.

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-141892, filed on Jul. 10, 2014, the entire contents of which are incorporated herein by reference.

FIELD

Embodiments described herein relate generally to a semiconductor device and a method of manufacturing the same.

BACKGROUND

Oxide semiconductors such as InGaZnO have been mainly applied to devices for displays. Application of oxide semiconductors to thin film field effect transistors formed on a wiring layer of a large scale integrated circuit (LSI) is expected. The thin film field effect transistors formed for LSIs are required to decrease their size.

Therefore, a top gate type structure formed on a conventional silicon substrate that can apply self-alignment process is desirable. However, formation of a diffusion layer by impurity implantation and the like cannot be performed on the oxide semiconductor transistors, which is different from conventional silicon transistors. Therefore, when the top gate type structure is employed, large parasitic resistance of source/drain regions becomes a problem.

DETAILED DESCRIPTION

A semiconductor device of an embodiment includes: an oxide semiconductor layer including a first region and a second region and third region provided between the first region and the second region, the oxide semiconductor layer containing indium (In), gallium (Ga), and zinc (Zn), the first and second regions having thinner film thickness and lower indium (In) concentration than the third region; a insulating film provided on the third region; a electrode provided on the insulating film; a first conductive layer provided under the first region and electrically connected with the first region; and a second conductive layer provided under the second region and electrically connected with the second region.

In the present specification, the same or similar members are denoted with the same reference sign, and overlapping description may be omitted.

Further, in the following description, "on", "under", "above", "below", "upper surface, and "lower surface" merely indicate relative positional relationship among parts and the like, and these terms do not define relationship between the parts and the gravity direction.

Hereinafter, embodiments of the present disclosure will be described with reference to the drawings.

First Embodiment

A semiconductor device of the present embodiment includes an oxide semiconductor layer including a channel region, a source region and a drain region, the channel region being provided between the source region and the drain region, the oxide semiconductor layer containing indium (In), gallium (Ga), and zinc (Zn), the drain region having thinner film thickness and lower indium (In) concentration than the channel region; a gate insulating film provided on the channel region; a gate electrode provided on the gate insulating film; a first conductive layer provided under the source region and electrically connected with the source region; and a second conductive layer provided under the drain region and electrically connected with the drain region.

Figure 1A:
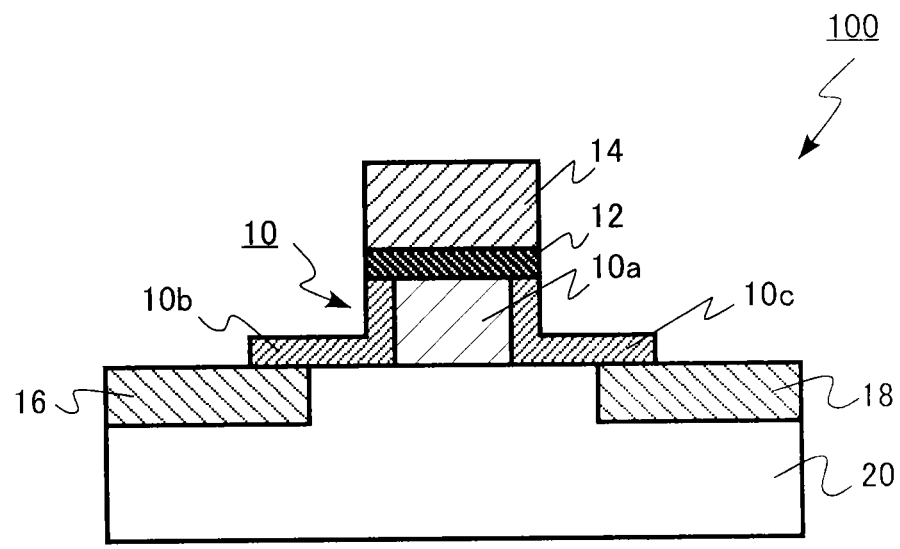
FIGS. 1A and 1B are schematic diagrams of a semiconductor device of a first embodiment.
Figure 1B:
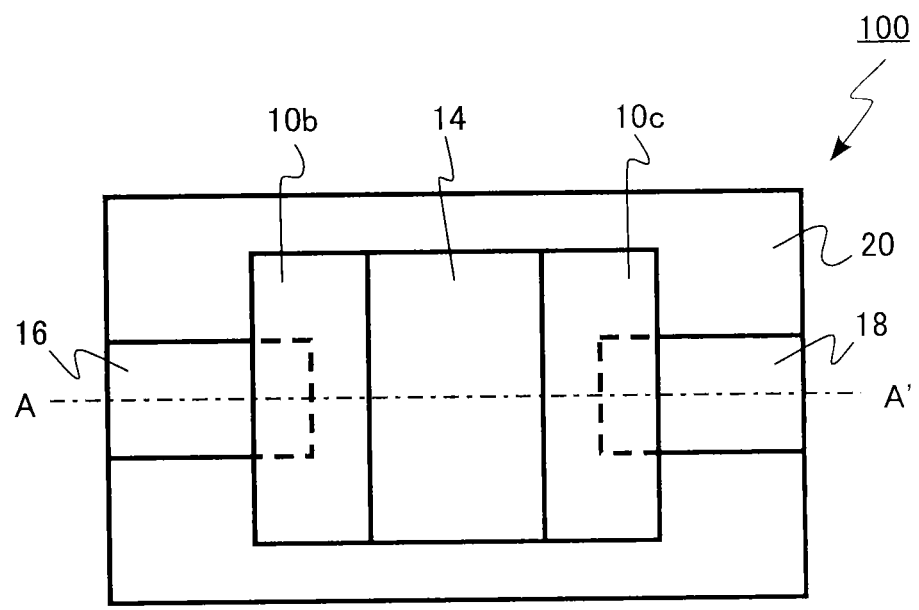

FIGS. 1A and 1B are schematic diagrams of the semiconductor device of the present embodiment. FIG. 1A is a cross-sectional view, and FIG. 1B is a top view. FIG. 1A is an AA' cross-sectional view of FIG. 1B.

A semiconductor device 100 of the present embodiment includes an oxide semiconductor layer 10, a gate insulating film 12, a gate electrode 14, a first conductive layer 16, a second conductive layer 18, and an interlayer insulating film 20. The semiconductor device 100 is a thin film field effect transistor using the oxide semiconductor layer 10.

The oxide semiconductor layer 10 contains indium (In), gallium (Ga), and zinc (Zn), as main components. The oxide semiconductor layer 10 is, for example, InGaZnO.

In the oxide semiconductor layer 10, indium, gallium, and zinc occupy 50 atom % or more of configuration elements other than oxides, for example. The oxide semiconductor layer 10 may contain at least one element selected from a group of hafnium (Hf), tin (Sn), aluminum (Al), zirconium (Zr), lithium (Li), scandium (Sc), and nitrogen (N), as an additive element.

The oxide semiconductor layer 10 is desirably amorphous for formation of the semiconductor device 100 at a low temperature. The oxide semiconductor layer 10 may be crystalline.

The oxide semiconductor layer 10 includes a channel region (third region) 10a, a source region (first region) 10b and a drain region (second region) 10c. The channel region 10a is provided at both sides of the gate electrode 14. The channel region 10a is provided between the source region 10b and a drain region 10c.

The film thickness of the source region 10b and the drain region 10c is thinner than that of the channel region 10a. The source region 10b and the drain region 10c have a so-called recessed structure.

Further, the indium concentration of the source region 10b and the drain region 10c is lower than the indium concentration of the channel region 10a. The indium concentration of the oxide semiconductor layer 10 can be measured with atom probe.

The film thickness of the source region 10b and the drain region 10c is desirably thinner than that of the channel region 10a in the entire region. However, the film thickness of the source region 10b and the drain region 10c may just be thinner than that of the channel region 10a in a part of the entire region. Especially, the film thickness of the source region 10b and the drain region 10c is desirably thinner in a region where the first conductive layer 16 and the source region 10b overlap with each other, and a region where the second conductive layer 18 and the drain region 10c overlap with each other.

The film thickness of the channel region 10a is desirably 10 nm or more to prevent a decrease in carrier mobility. Further, the film thickness of the source region 10b and the drain region 10c is desirably 5 nm or less to decrease the parasitic resistance. The film thickness of the oxide semiconductor layer 10 can be measured on an image of a transmission electron microscope (TEM), for example.

The indium concentration of the source region 10b and the drain region 10c is concentration in the center in a film thickness direction, for example. Further, the indium concentration of the channel region 10a is concentration in the center in the film thickness direction immediately under the center of the gate electrode 14.

The indium concentration of the source region 10b and the drain region 10c is desirably lower than that of the channel region 10a in the entire region. However, the indium concentration of the source region 10b and the drain region 10c may just be lower than that of the channel region 10a in a part of the entire region. Especially, the indium concentration of the source region 10b and the drain region 10c is desirably lower in a region where the first conductive layer 16 and the source region 10b overlap each other, and a region where the second conductive layer 18 and the drain region 10c overlap with each other. Especially, the indium concentration of the source region 10b and the drain region 10c is desirably lower in a vicinity of a boundary between the first conductive layer 16 and the source region 10b, and in a vicinity of a boundary of the second conductive layer 18 and the drain region 10c.

The indium concentration of the source region 10b and the drain region 10c is desirably 80% or less than the indium concentration of the channel region 10a to decrease the parasitic resistance.

The gate insulating film 12 is provided on the channel region 10a. The gate insulating film is, for example, a silicon oxide film, a silicon nitride film, a silicon oxynitride film, an aluminum oxide ($Al_2O_3$) film, a high-k film containing Hf, a laminated film of the aforementioned films, or the like.

The gate electrode 14 is provided on the gate insulating film 12. The gate electrode 14 is, for example, metal. A material of the gate electrode 14 is, for example, metal such as copper (Cu), titanium (Ti), molybdenum (Mo), aluminum (Al), or tungsten (W), an alloy of the aforementioned metal, or the like.

The first conductive layer 16 being in contact with the source region 10b is provided under the source region 10b, and the second conductive layer 18 being in contact with the drain region 10c is provided under the drain region 10c. The first conductive layer 16 is electrically conductive to the source region 10b. Further, the second conductive layer 18 is electrically conductive to the drain region 10c. Another conductive material may be interposed between the source region 10b and the first conductive layer 16, or the drain region 10c and the second conductive layer 18.

The first conductive layer 16 and the second conductive layer 18 are connected through the oxide semiconductor layer 10. The first conductive layer 16 and the second conductive layer 18 desirably do not overlap with the gate electrode 14 on the oxide semiconductor layer 10.

The first conductive layer 16 and the second conductive layer 18 are, for example, one of wiring layers that configure multilayer wiring. The first conductive layer 16 and the second conductive layer 18 are, for example, metal. As materials of the first conductive layer 16 and the second conductive layer 18, metal such as copper (Cu), titanium (Ti), molybdenum (Mo), aluminum (Al), or tungsten (W), an alloy of the aforementioned metal, or the like is used.

The first conductive layer 16 and the second conductive layer 18 are formed on the interlayer insulating film 20. The interlayer insulating film 20 is, for example, a silicon oxide film.

Next, a method of manufacturing a semiconductor device of the present embodiment will be described. FIGS. 2 to 8 are schematic cross-sectional views illustrating a method of manufacturing a semiconductor device of the present embodiment. FIGS. 2 to 8 illustrate cross sections corresponding to the AA' cross section of FIG. 1B.

Figure 2:
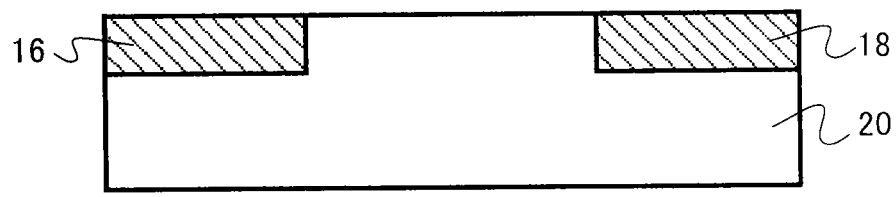
FIG. 2 is a schematic cross-sectional view illustrating a method of manufacturing a semiconductor device according to the first embodiment.

The first conductive layer 16 and the second conductive layer 18 are formed on the interlayer insulating film 20 (FIG. 2). The first conductive layer 16 and the second conductive layer 18 can be formed such that a metal film is embedded in a groove provided in a surface of the interlayer insulating film 20, and is planaraized by a chemical mechanical polishing (CMP) method or the like.

Figure 3:
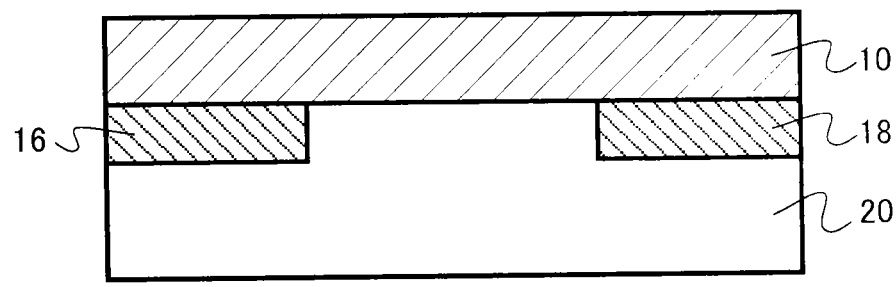
FIG. 3 is a schematic cross-sectional view illustrating the method of manufacturing a semiconductor device according to the first embodiment.

Next, the oxide semiconductor layer 10 containing indium (In), gallium (Ga), and zinc (Zn), for example, InGaZnO is formed on the first conductive layer 16 and the second conductive layer 18 (FIG. 3). The oxide semiconductor layer 10 is formed by, for example, a sputtering method. The film thickness of the oxide semiconductor layer 10 is desirably 10 nm or more.

Figure 4:
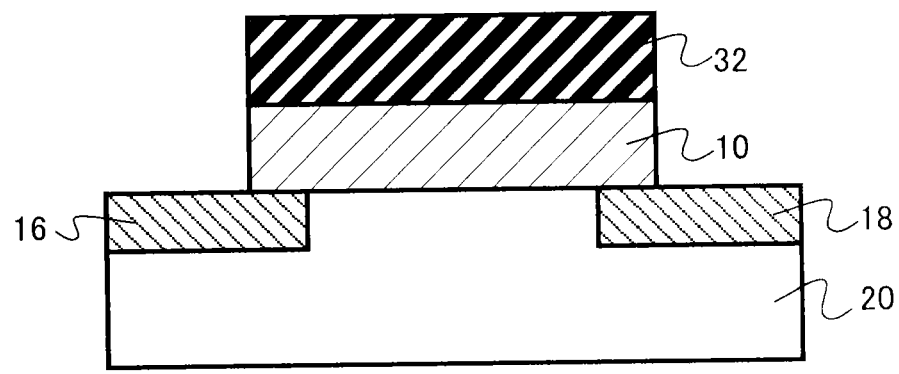
FIG. 4 is a schematic cross-sectional view illustrating the method of manufacturing a semiconductor device according to the first embodiment.

Next, the oxide semiconductor layer 10 is patterned using a mask material 32 as a mask (FIG. 4). At this time, at least a part of the oxide semiconductor layer 10 is caused to remain on the first conductive layer 16 and the second conductive layer 18. The oxide semiconductor layer 10 is patterned to extend over the first conductive layer 16 and the second conductive layer 18.

The mask material 32 is, for example, a resist mask formed by a lithography method. Further, the patterning of the oxide semiconductor layer 10 can be performed by dry etching or wet etching, for example. After the patterning of the oxide semiconductor layer 10, the mask material 32 is removed.

Figure 5:
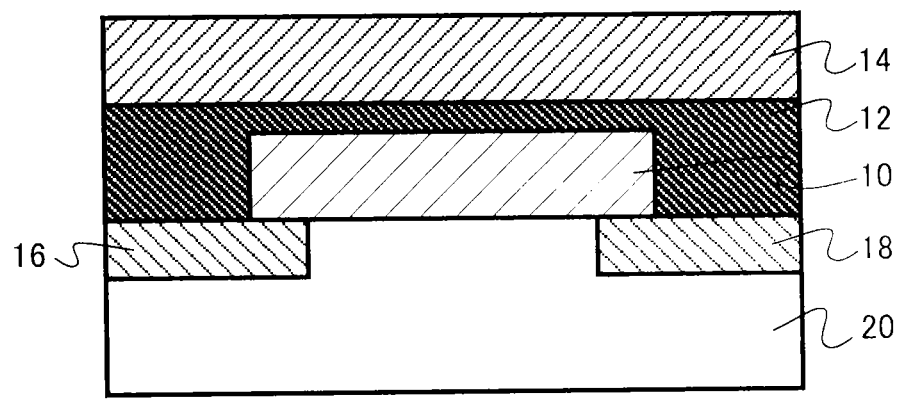
FIG. 5 is a schematic cross-sectional view illustrating the method of manufacturing a semiconductor device according to the first embodiment.

Next, the gate insulating film 12 and the gate electrode 14 are formed on the oxide semiconductor layer 10 (FIG. 5). The gate insulating film 12 is formed by a chemical vapor deposition (CVD) method, for example. Further, the gate electrode 14 is formed by a CVD method or a sputtering method, for example.

Figure 6:
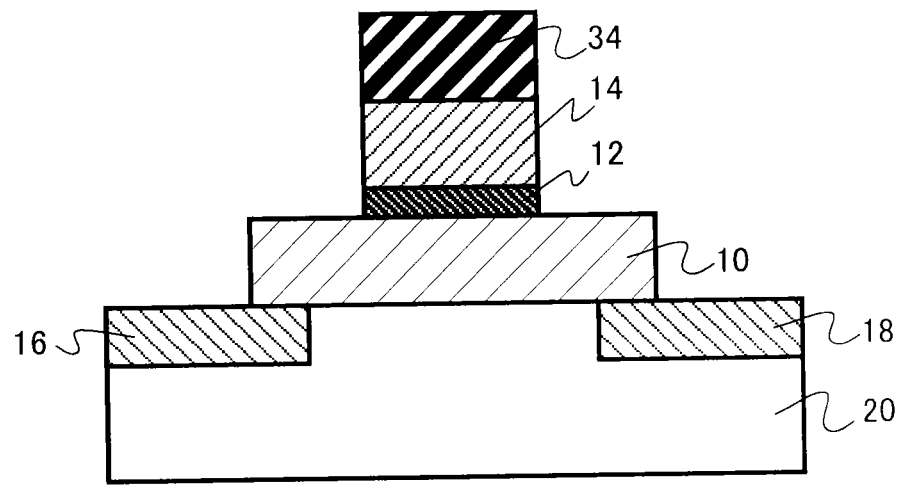
FIG. 6 is a schematic cross-sectional view illustrating the method of manufacturing a semiconductor device according to the first embodiment.

Next, a mask material 34 is formed, and the gate insulating film 12 and the gate electrode 14 are patterned (FIG. 6). The mask material 34 is, for example, a resist mask formed by a lithography method. Further, the patterning of the gate insulating film 12 and the gate electrode 14 can be performed by dry etching or wet etching, for example.

Figure 7:
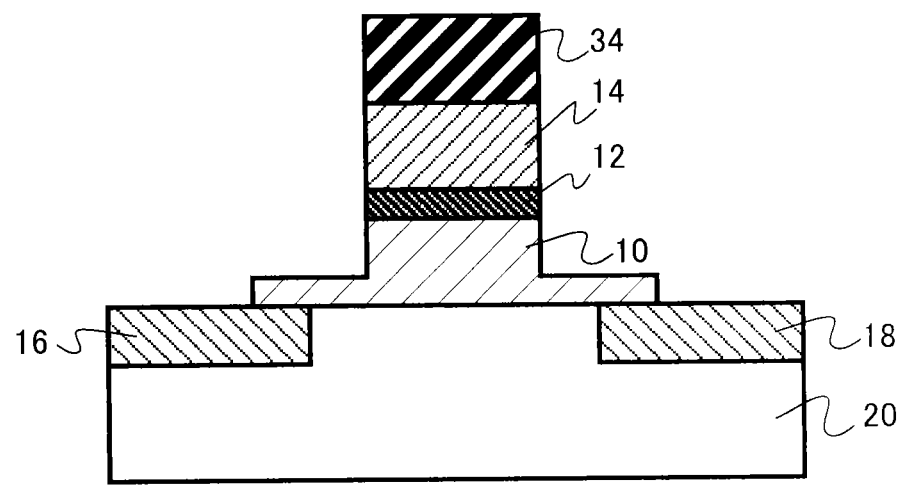
FIG. 7 is a schematic cross-sectional view illustrating the method of manufacturing a semiconductor device according to the first embodiment.

Next, a part of the oxide semiconductor layer 10 at both sides of the gate electrode 14 is etched using the mask material 34 and the gate electrode 14 as a mask (FIG. 7). The etching of the oxide semiconductor layer 10 can be performed by dry etching or wet etching, for example. In this etching, the film thickness of the oxide semiconductor layer 10 at both side of the gate electrode 14 desirably becomes 5 nm or less. After the patterning of the oxide semiconductor layer 10, the mask material 34 is removed.

Figure 8:
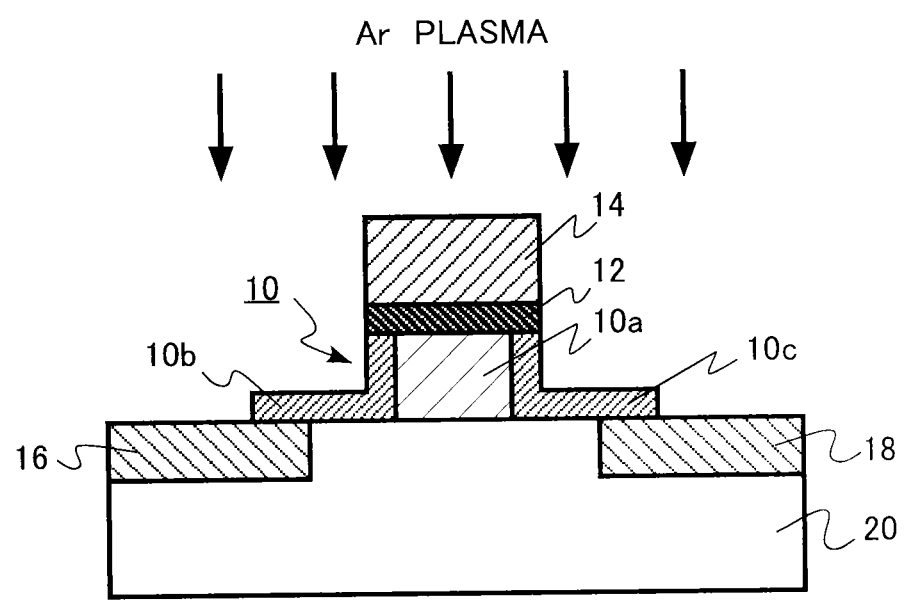
FIG. 8 is a schematic cross-sectional view illustrating the method of manufacturing a semiconductor device according to the first embodiment.

Next, argon (Ar) plasma treatment is performed. By the argon plasma treatment, the In concentration of the oxide semiconductor layer 10 having an exposed surface is decreased to decrease the resistance, and the source region 10b and the drain region 10c having low resistance and interposing the channel region 10a are formed in the oxide semiconductor layer 10 (FIG. 8).

Note that the plasma treatment may be processed using another plasma, such as helium plasma or hydrogen plasma, instead of the processing using argon plasma. For example, heat treatment in a non-oxidizing atmosphere such as nitrogen anneal or argon anneal can be performed in place of the plasma treatment.

The indium concentration of the oxide semiconductor layer 10 at both sides of the gate electrode 14, that is, the indium concentration of the source region 10b and the drain region 10c is desirably 80% or less of the indium concentration of the oxide semiconductor layer 10 immediately under the gate electrode 14, that is, the indium concentration of the channel region 10a.

The semiconductor device 100 of the present embodiment illustrated in FIG. 1 is manufactured by the above manufacturing method.

Next, function and effect of the semiconductor device and the method of manufacturing the same of the present embodiment will be described.

Figure 9:
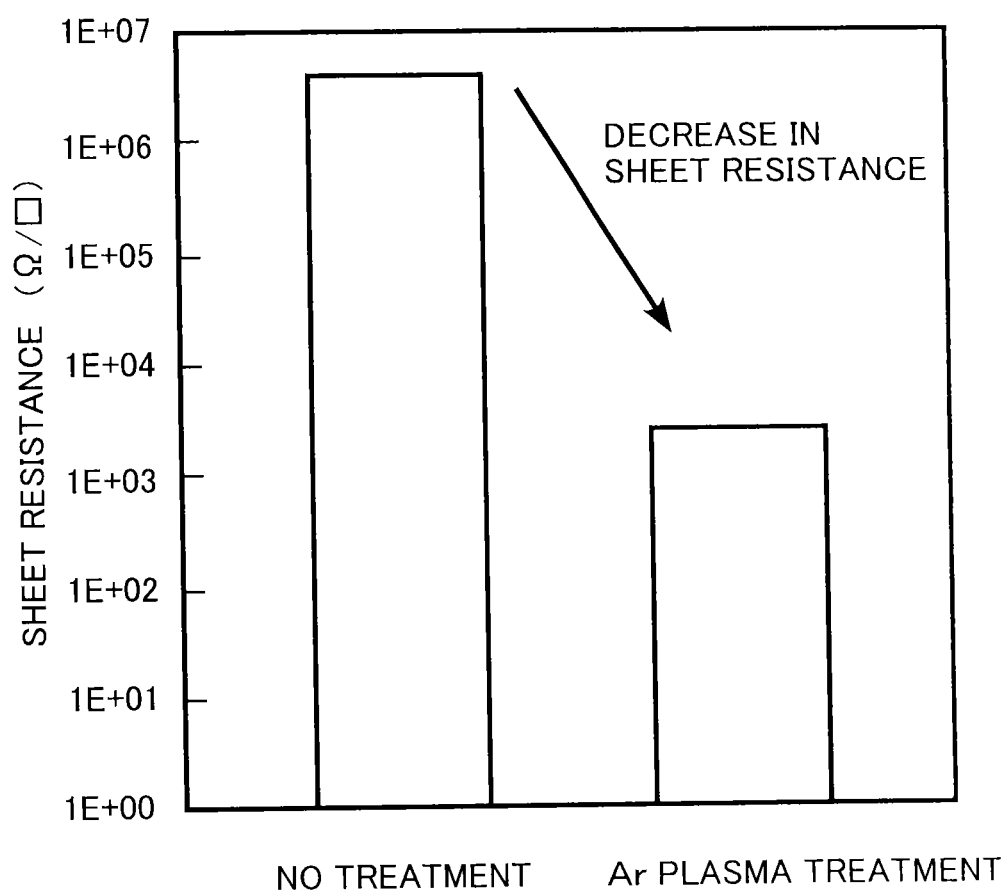
FIG. 9 is an explanatory diagram of function and effect of the first embodiment.

FIG. 9 is an explanatory diagram of function and effect of the present embodiment. FIG. 9 illustrates decreasing effect of sheet resistance of when argon plasma treatment is applied to the InGaZnO film having the film thickness of 30 nm.

It is found that the sheet resistance is decreased by two orders or more by the argon plasma treatment. The decrease in the sheet resistance is caused due to an increase in carrier density in the oxide semiconductor.

Figure 10:
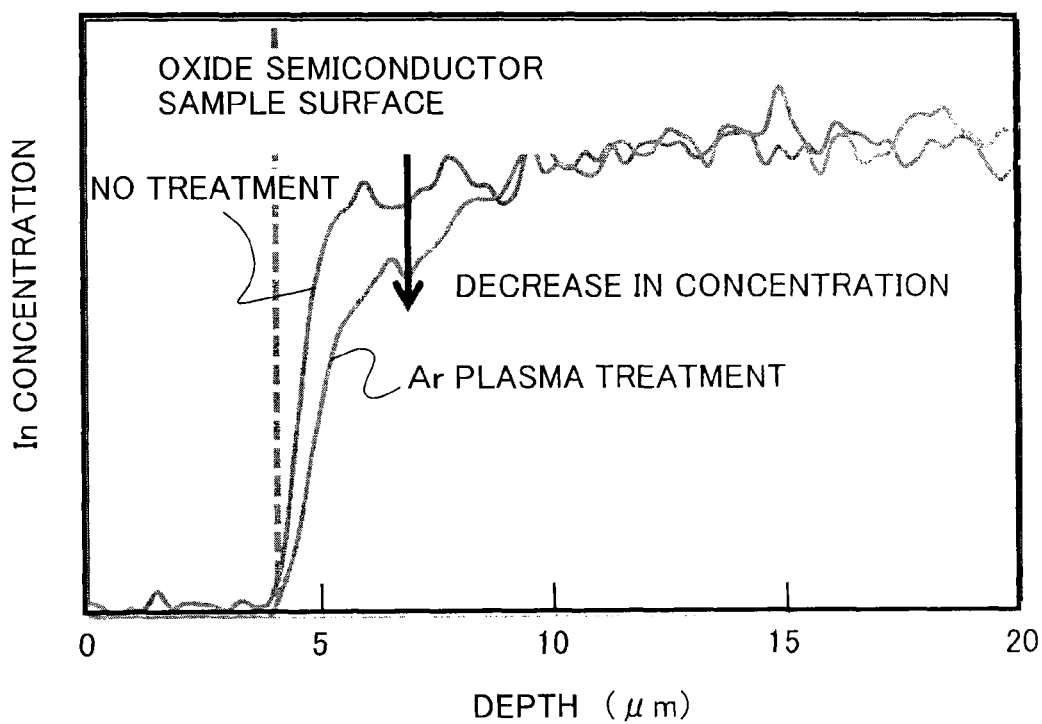
FIG. 10 is an explanatory diagram of function and effect of the first embodiment.

FIG. 10 is an explanatory diagram of the function and effect of the present embodiment. FIG. 10 illustrates profiles of the indium (In) concentration in the depth direction of a sample subjected to the argon plasma treatment of FIG. 9, and of a sample not subjected to the argon plasma treatment. The In concentration is measured with a scanning transmission electron microscopy electron energy loss spectroscopy (STEM-EELS).

It is found that the In concentration is decreased in a region of 5 nm or less from a surface of the sample subjected to the argon plasma treatment. Therefore, a decrease in the sheet resistance of the InGaZnO film due to the decrease in the In concentration can be considered. The indium concentration of the sample subjected to the argon plasma treatment is 80% of the indium concentration of the sample not subjected to the treatment.

Note that a remarkable decrease in the In concentration is not observed in a region deeper than 5 nm even if conditions of the plasma treatment and the heat treatment are changed.

When the film thickness of the oxide semiconductor layer containing indium (In), gallium (Ga), and zinc (Zn) becomes thin, the mobility of a carrier is decreased. Especially, in the film thickness less than 10 nm, the decrease in the mobility becomes remarkable. When the mobility is decreased, an ON current of the field effect type transistor is decreased.

Meanwhile, when the sheet resistance of the source region and the drain region is too high, the ON current is decreased due to an increase in the parasitic resistance of the field effect type transistor.

In the thin film field effect type transistor 100 of the present embodiment, the film thickness of the source region 10b and the drain region 10c of the oxide semiconductor layer 10 is made thinner than that of the channel region 10a. Further, the In concentration of the source region 10b and the drain region 10c of the oxide semiconductor layer 10 is made lower than that of the channel region 10a. With the configuration, low resistance of the source region 10b and the drain region 10c can be realized while the mobility in the channel region 10a is maintained. Therefore, the thin film field effect type transistor 100 with an improved ON current can be realized.

Further, the source region 10b and the drain region 10c have low In concentration and low resistance not only on the top surface side but also on the back surface side, due to the thin film. Therefore, contact resistance between the source region 10b and the drain region 10c, and the first conductive layer 16 and the second conductive layer 18 provided on the back surface side (lower side) of the source region 10b and the drain region 10c is decreased. Therefore, the parasitic resistance is decreased, and the thin film field effect type transistor 100 with an improved ON current can be realized.

Especially, the film thickness of the source region 10b and the drain region 10c of the oxide semiconductor layer 10 before the plasma treatment is caused to be 5 nm or less, so that the resistance of the entire region of the source region 10b and the drain region 10c can be decreased. By the decrease in the resistance of the entire region of the source region 10b and the drain region 10c, characteristics of each transistor become stabilized, and thus variation of device characteristics can be suppressed.

Further, the thin film field effect type transistor 100 of the present embodiment has a top gate type structure in which the gate electrode 14 is formed on the upper side of the channel region 10a, and the source region 10b and the drain region 10c can be formed by self-aligned process with respect to the gate electrode 14. Therefore, overlap capacitance between the gate electrode 14, and the source region 10b and the drain region 10c can be made small. Therefore, the parasitic capacitance is decreased, and an operating speed is improved.

Further, in the thin film field effect type transistor 100 of the present embodiment, the surfaces of the source region 10b and the drain region 10c are lower than an interface between the gate insulating film 12 and the gate electrode 14. Therefore, capacitance between side surfaces of the gate electrode 14, and the source region 10b and the drain region 10c is also decreased. Therefore, the parasitic capacitance between the gate electrode 24, and the source region 10b and the drain region 10c is further decreased, and the operating speed is improved.

Further, in the thin film field effect type transistor 100 of the present embodiment, the source region 10b and the drain region 10c can be formed by self-alignment with respect to the gate electrode 14. Therefore, for example, an alignment margin between the source region 10b and the drain region 10c, and the gate electrode 14 at the time of manufacturing becomes unnecessary. Therefore, a semiconductor device having high integration can be realized by application of the thin film field effect type transistor 100 of the present embodiment.

Further, the thin film field effect type transistor 100 of the present embodiment forms contacts with the first conductive layer 16 and the second conductive layer 18 as wiring layers at the lower surfaces of the source region 10b and the drain region 10c. Therefore, the thin film field effect type transistor 100 can be connected with a wiring layer without separately introducing connection parts such as contact plugs on the source region 10b and the drain region 10c. Therefore, a semiconductor device that can be easily manufactured and has high integration can be realized.

Second Embodiment

A semiconductor device of the present embodiment is similar to that of the first embodiment except that gate sidewalls are provided at both sides of a gate electrode. Therefore, description of content overlapping with the first embodiment is omitted.

Figure 11A:
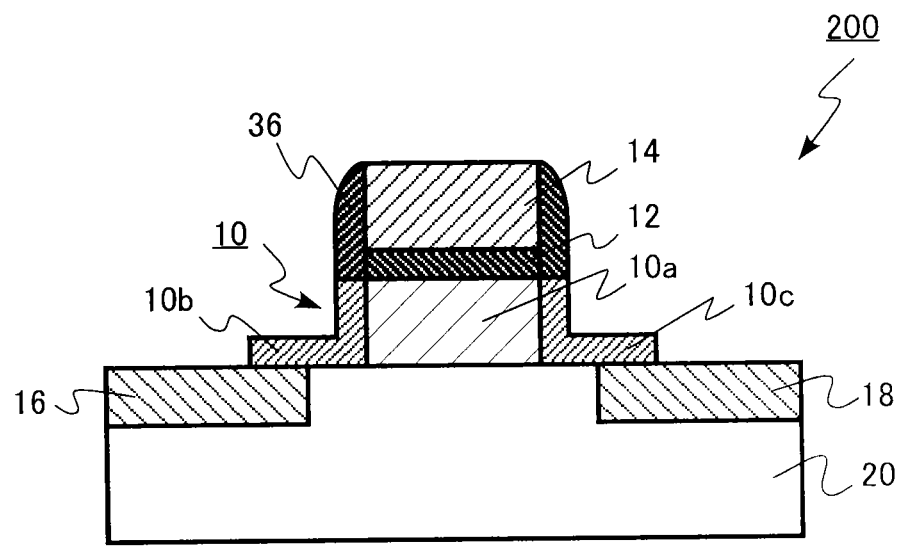
FIGS. 11A and 11B are schematic diagrams of a semiconductor device of a second embodiment.
Figure 11B:
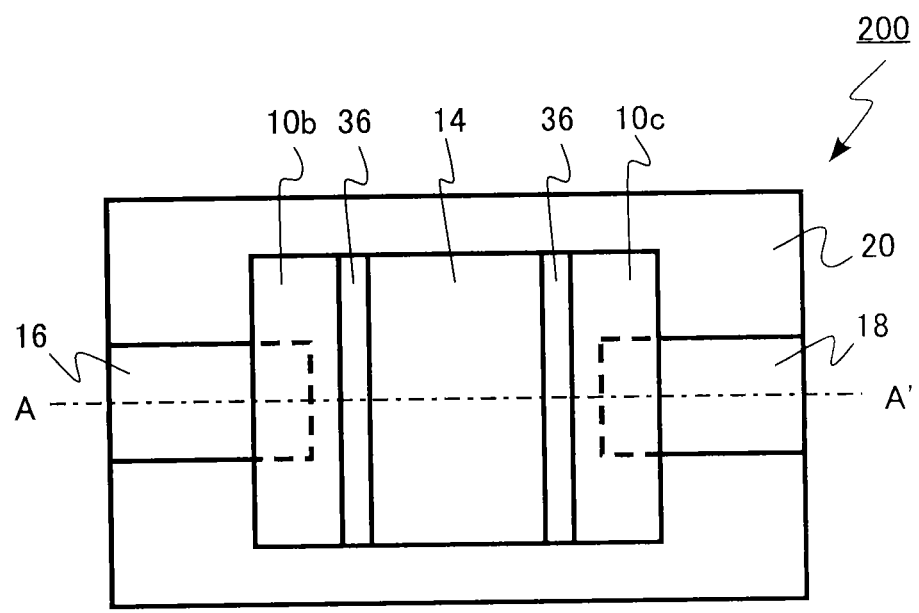

FIGS. 11A and 11B are schematic diagrams of a semiconductor device of the present embodiment. FIG. 11A is a cross-sectional view, and FIG. 11B is a top view. FIG. 11A is an AA' cross-sectional view of FIG. 11B.

In a semiconductor device 200 of the present embodiment, gate sidewalls (side layers) 36 are provided at both sides of a gate electrode 14. The gate sidewalls 36 are an insulating film. The gate sidewalls 36 are, for example, a silicon oxide film, a silicon nitride film, or a silicon oxynitride film.

Next, a method of manufacturing a semiconductor device of the present embodiment will be described. FIGS. 12 to 15 are schematic cross-sectional views illustrating a method of manufacturing a semiconductor device of the present embodiment. FIGS. 12 to 15 illustrate cross sections corresponding to the AA' cross section of FIG. 11B.

Figure 12:
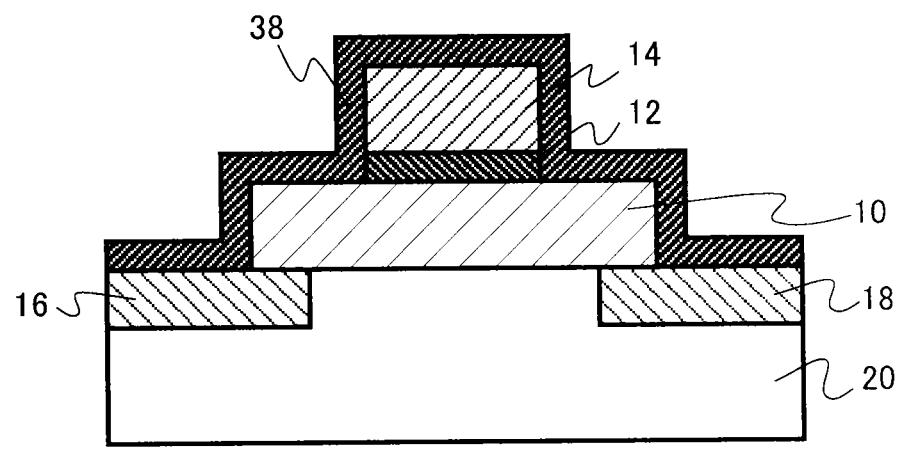
FIG. 12 is a schematic cross-sectional view illustrating a method of manufacturing a semiconductor device according to the second embodiment.

Similarly to the first embodiment, a mask material is formed, and a gate insulating film 12 and the gate electrode 14 are patterned. After the gate insulating film 12 and the gate electrode 14 are patterned, the mask material is removed. Then, a gate sidewall film 38 is formed on the gate electrode 14 and an oxide semiconductor layer 10 (FIG. 12). The gate sidewall film 38 is formed by a CVD method, for example.

Figure 13:
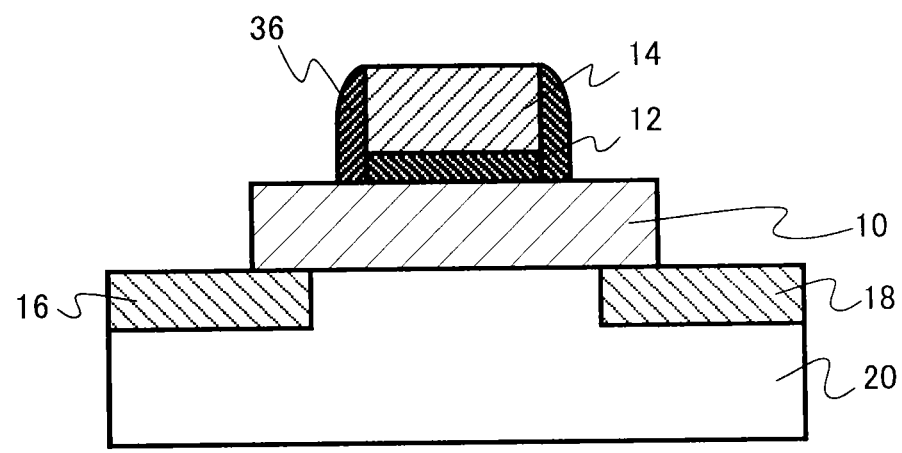
FIG. 13 is a schematic cross-sectional view illustrating the method of manufacturing a semiconductor device according to the second embodiment.

Next, the gate sidewall film 38 is etched, and the gate sidewalls 36 are formed (FIG. 13). The etching of the gate sidewall film 38 is performed by dry etching having high anisotropy such as reactive ion etching (RIE).

Figure 14:
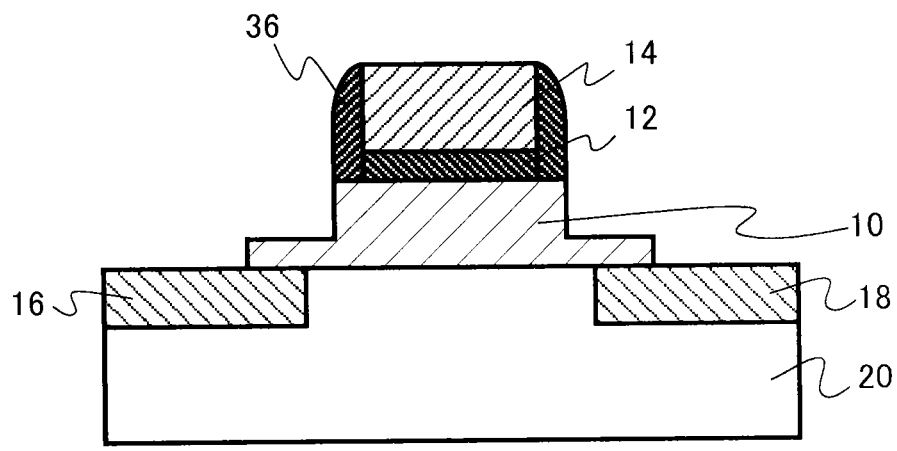
FIG. 14 is a schematic cross-sectional view illustrating the method of manufacturing a semiconductor device according to the second embodiment.

Next, a part of the oxide semiconductor layer 10 at both sides of the gate electrode 14 is etched using the gate electrode 14 and the gate sidewalls 36 as a mask (FIG. 14). The etching of the oxide semiconductor layer 10 can be performed by dry etching or wet etching, for example. In this etching, the film thickness of the oxide semiconductor layer 10 at both sides of the gate electrode 14 after etching is desirably 5 nm or less.

Figure 15:
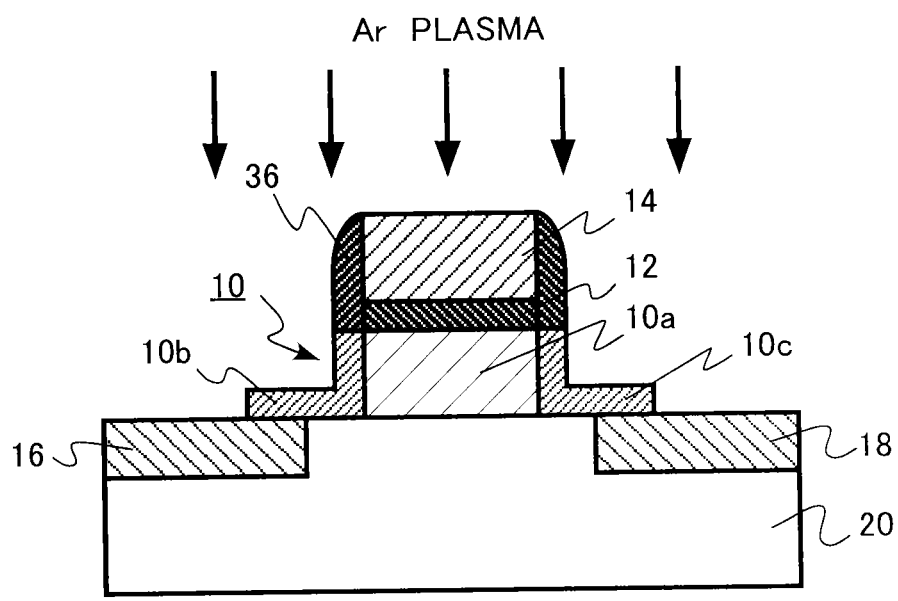
FIG. 15 is a schematic cross-sectional view illustrating the method of manufacturing a semiconductor device according to the second embodiment.

Next, argon (Ar) plasma treatment is performed. By the argon plasma treatment, the In concentration of the oxide semiconductor layer 10 having an exposed surface is decreased to decrease resistance, and a source region 10b and a drain region 10c having low resistance and interposing a channel region 10a are formed in the oxide semiconductor layer 10 (FIG. 15).

The semiconductor device 200 of the present embodiment illustrated in FIG. 11 is manufactured by the above manufacturing method.

In a thin film field effect type transistor 100 of the present embodiment, an amount of overlapping of the gate electrode 14, and the source region 10b and the drain region 10c becomes smaller than that of the first embodiment, by providing of the gate sidewalls 36. Therefore, overlap capacitance between the gate electrode 14, and the source region 10b and the drain region 10c can be made small. Therefore, parasitic capacitance is further decreased, and an operating speed is improved.

Third Embodiment

A semiconductor device of the present embodiment includes: a semiconductor layer; a first transistor including a first gate insulating film provided on the semiconductor layer, and a first gate electrode provided on the first gate insulating film; a second transistor including an oxide semiconductor layer, a second gate insulating film and a second gate electrode, the oxide semiconductor layer having a channel region, a source region and a drain region, the channel region being provided between the source region and the drain region, the oxide semiconductor layer containing indium (In), gallium (Ga), and zinc (Zn), the drain region having thinner film thickness and lower indium (In) concentration than the channel region, the second gate insulating film being provided on the channel region, and the second gate electrode being provided on the second gate insulating film; an interlayer insulating film being provided between the second transistor and the first transistor; a first conductive layer provided under the source region and electrically connected with the source region; and a second conductive layer provided under the drain region and electrically connected with the drain region.

In the semiconductor device of the present embodiment, the second transistor having the oxide semiconductor layer as a channel region is formed above the first transistor having the semiconductor layer as a channel region. The interlayer insulating film is formed between the first transistor and the second transistor. The configuration of the second transistor is similar to that of the thin film field effect type transistor of the first embodiment. Therefore, description of content overlapping with the first embodiment is omitted.

Figure 16:
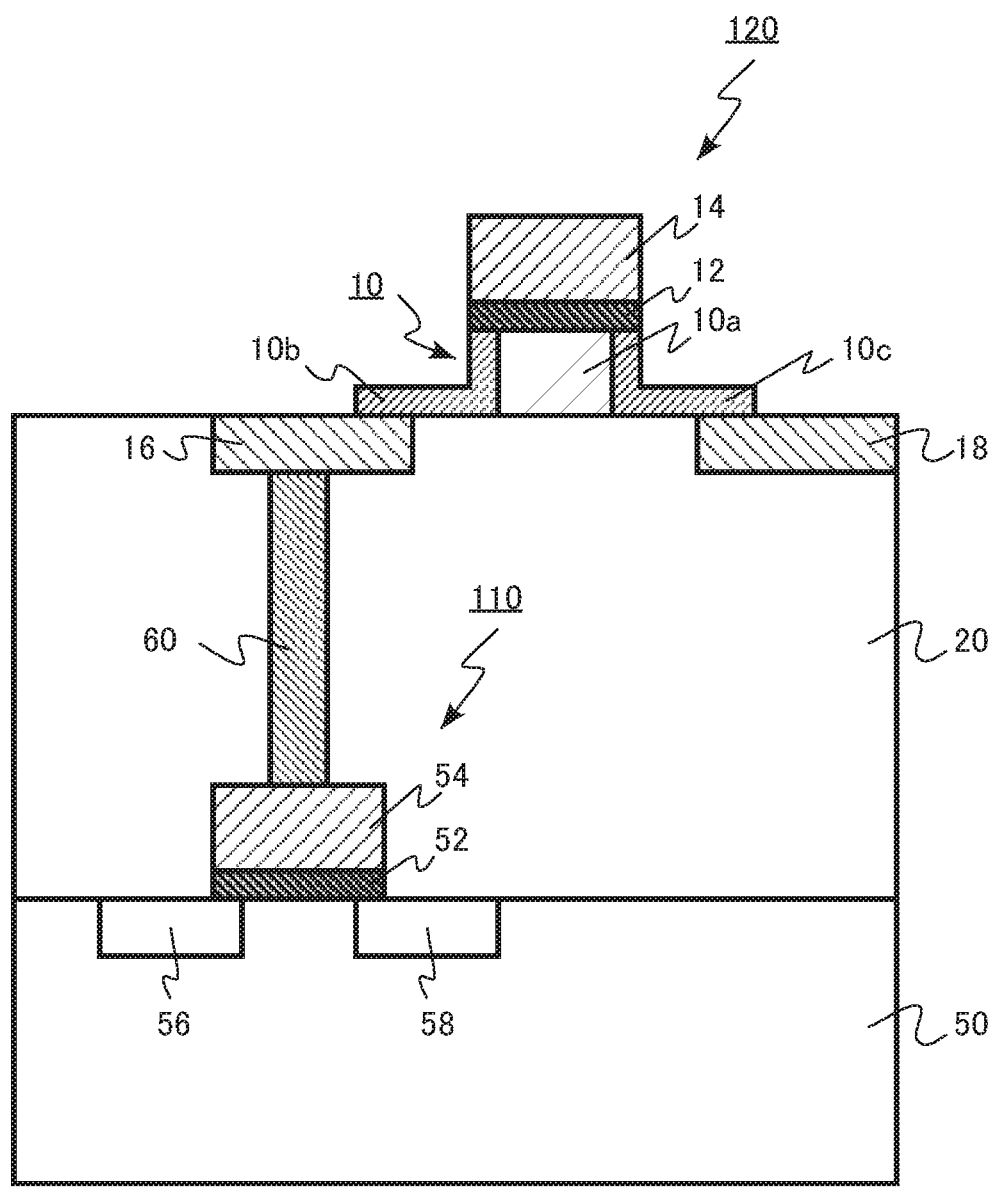
FIG. 16 is a schematic cross-sectional view of a semiconductor device of a third embodiment.

FIG. 16 is a schematic cross-sectional view of a semiconductor device of the present embodiment. The semiconductor device of the present embodiment includes a first transistor 110 and a second transistor 120. The first transistor is, for example, a field effect type transistor having a single crystal semiconductor substrate (semiconductor layer) as a channel region. The second transistor 120 has a similar configuration to the thin film field effect type transistor 100 of the first embodiment.

The semiconductor device of the present embodiment is formed on a semiconductor substrate (semiconductor layer) 50. The semiconductor substrate 50 is a single crystal semiconductor. The semiconductor substrate 50 is, for example, a single crystal silicon substrate.

The first transistor 110 includes a gate insulating film (first gate insulating film) 52 formed on the semiconductor substrate 50 and a gate electrode (first gate electrode) 54 provided on the gate insulating film 52. Further, a source region 56 and a drain region 58 are provided on a surface of the semiconductor substrate 50 at both sides of the gate electrode 54. The source region 56 and the drain region 58 are formed with a diffusion layer of impurities, for example. The semiconductor substrate 50 between the source region 56 and the drain region 58 serves as the channel region of the first transistor 110.

The second transistor 120 is provided above the semiconductor substrate 50, interposing an interlayer insulating film 20 between the second transistor 120 and the first transistor 110. The second transistor 120 includes: an oxide semiconductor layer 10 containing indium (In), gallium (Ga), and zinc (Zn), and including a channel region 10*a*, and a source region 10*b* and a drain region 10*c* having thinner film thickness and lower indium (In) concentration than the channel region 10*a*. The channel region 10*a* is provided between the source region 10*b* and the drain region 10*c*. The second transistor 120 includes a gate insulating film (second gate insulating film) 12 provided on the channel region 10*a* and a gate electrode (second gate electrode) 14 provided on the gate insulating film 12.

The second transistor 120 includes a first conductive layer 16 provided under the source region 10*b* of the second transistor 120 and is electrically connected with the source region 10*b*, and a second conductive layer 18 provided under the drain region 10*c* and is electrically connected with the drain region 10*c*.

The gate electrode (first gate electrode) 54 of the first transistor 110 and the first conductive layer 16 are connected with a conductive contact plug 60. The contact plug 60 is metal, for example. The gate electrode (first gate electrode) 54 of the first transistor 110 is electrically connected with the source region 10*b* of the second transistor 120 through the contact plug 60 and the first conductive layer 16.

According to the semiconductor device of the present embodiment, the second transistor is formed above the first transistor 110 formed on the semiconductor substrate 50. With the configuration, electronic circuits using transistors can be realized in a plurality of layers, and integration of the semiconductor device is improved.

Further, the second transistor can be formed at a low process temperature. Therefore, the semiconductor device can be manufactured without deteriorating characteristics of the first transistor formed first.

As details have been described in the first embodiment, the second transistor 120 of the present embodiment has a structure suitable for improvement of integration, because of a self-alignment structure, and a structure in which the source region 10*b* and the drain region 10*c* have a contact with the first conductive layer 16 and the second conductive layer 18 at lower surfaces of the source region 10*b* and the drain region 10*c*. Therefore, the integration of the semiconductor device can be further improved.

Note that, for example, non-volatile memory can be configured using the first transistor as a floating gate type memory cell, and the second transistor as a transistor of a peripheral circuit of a memory cell array. Further, for example, a logic IC can be configured using the first transistor and the second transistor as transistors that configure a logic circuit.

While certain embodiments have been described, these embodiments have been presented by way of example only, and are not intended to limit the scope of the inventions. Indeed, a semiconductor device and a method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an oxide semiconductor layer including a first region, a second region and a third region provided between the first region and the second region, the oxide semiconductor layer containing indium (In), gallium (Ga), and zinc (Zn), the first and second regions having lower indium (In) concentration than the third region;
   an insulating film provided on the third region;
   an electrode provided on the insulating film;
   a first conductive layer provided under the first region and electrically connected with the first region; and
   a second conductive layer provided under the second region and electrically connected with the second region,
   wherein
   film thickness of the first region directly above an edge of the first conductive layer and film thickness of the second region directly above an edge of the second conductive layer are thinner than film thickness of a middle portion of the third region.

2. The device according to claim 1, wherein the film thickness of the third region is 10 nm or more, and the film thickness of the first and the second region is 5 nm or less.

3. The device according to claim 1, wherein the oxide semiconductor layer further contains at least one element selected from a group of hafnium (Hf), tin (Sn), aluminum (Al), zirconium (Zr), lithium (Li), scandium (Sc), and nitrogen (N).

4. The device according to claim 1, wherein the indium concentration of each of the first and the second regions is 80% or less of the indium concentration of the third region.

5. The device according to claim 1, further comprising side layers provided at both sides of the electrode.

6. The device according to claim 1, wherein the electrode is metal.

7. The device according to claim 1, wherein the first conductive layer and the second conductive layer are metal.

8. A semiconductor device comprising:
   an oxide semiconductor layer including a first region, a second region and a third region provided between the first region and the second region, the oxide semiconductor layer containing indium (In), gallium (Ga), and zinc (Zn), the first and second regions having thinner film thickness and lower indium (In) concentration than the third region, the film thickness of the third region being 10 nm or more, the film thickness of the first and the second region being 5 nm or less, and the indium concentration of each of the first and the second regions being 80% or less of the indium concentration of the third region;

an insulating film provided on the third region;

an electrode provided on the insulating film;

a first conductive layer provided under the first region and electrically connected with the first region; and a second conductive layer provided under the second region and electrically connected with the second region.

* * * * *